(12) United States Patent
Shibaguchi et al.

(10) Patent No.: US 12,094,539 B2
(45) Date of Patent: Sep. 17, 2024

(54) SEMICONDUCTOR MEMORY WITH CHARGE TRANSFER REDUCTION TRANSISTOR

(71) Applicant: LAPIS Semiconductor Co., Ltd., Yokohama (JP)

(72) Inventors: Taku Shibaguchi, Yokohama (JP); Toru Mori, Yokohama (JP); Kenji Oonuki, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 46 days.

(21) Appl. No.: 17/706,484

(22) Filed: Mar. 28, 2022

(65) Prior Publication Data

US 2022/0319609 A1 Oct. 6, 2022

(30) Foreign Application Priority Data

Mar. 31, 2021 (JP) .................................. 2021-059975
Mar. 23, 2022 (JP) .................................. 2022-047032

(51) Int. Cl.
*G11C 16/14* (2006.01)
*G11C 5/06* (2006.01)
*G11C 16/28* (2006.01)

(52) U.S. Cl.
CPC ................ *G11C 16/14* (2013.01); *G11C 5/06* (2013.01); *G11C 16/28* (2013.01)

(58) Field of Classification Search
CPC .......... G11C 16/14; G11C 5/06; G11C 16/28; G11C 5/063; G11C 16/0408; G11C 16/0441; G11C 16/10
See application file for complete search history.

(56) References Cited

U.S. PATENT DOCUMENTS

| | | | |
|---|---|---|---|
| 6,515,899 B1* | 2/2003 | Tu | G11C 16/0433 365/185.28 |
| 2008/0142876 A1* | 6/2008 | Arigane | H10B 69/00 257/E27.103 |
| 2014/0177338 A1* | 6/2014 | Ching | H01L 29/7881 257/319 |
| 2015/0221372 A1* | 8/2015 | Milani | H01L 29/7881 438/257 |
| 2022/0216396 A1* | 7/2022 | Huang | H10N 52/80 |

FOREIGN PATENT DOCUMENTS

JP 2019062065 A 4/2019

* cited by examiner

*Primary Examiner* — Donald HB Braswell
(74) *Attorney, Agent, or Firm* — Rabin & Berdo, P.C.

(57) ABSTRACT

A semiconductor device includes a semiconductor substrate and a first memory cell disposed on the semiconductor substrate. The first memory cell includes a first write and erasure transistor, a first read transistor, and a first charge transfer reduction transistor. The first write and erasure transistor controls data writing and erasing. The first read transistor controls data reading. The first charge transfer reduction transistor reduces injection of an electric charge to the first write and erasure transistor and the first read transistor.

23 Claims, 13 Drawing Sheets

MC3A

| #3 | WRITE | ERASE | READ |
|---|---|---|---|
| BL | 0 | 0 | 1.5 |
| TL2A | 0 | 9.1 | 0 |
| WL | 9.1 | 0 | 1.5 |
| SL | 4.5 | 4.5 | 0 |
| RL2 | 0 | 0 | 1.5 |

MC2A

| #2 | WRITE | ERASE | READ |
|---|---|---|---|
| BL | 0 | 0 | 1.5 |
| TL1A | 0 | 9.1 | 0 |
| WL | 9.1 | 0 | 1.5 |
| SL | 4.5 | 4.5 | 0 |
| RL1 | 0 | 0 | 0 |

MC3B (COMPLEMENTARY)

| #3' | WRITE | ERASE | READ |
|---|---|---|---|
| BL2 | 0 | 0 | 1.5 |
| TL2B | 0 | 9.1 | 0 |
| WL | 9.1 | 0 | 1.5 |
| SL | 4.5 | 4.5 | 0 |
| RL2 | 0 | 0 | 1.5 |

MC5A

| #5 | WRITE | ERASE | READ |
|---|---|---|---|
| BL | 0 | 0 | 1.5 |
| TL2A | 0 | 9.1 | 0 |
| WL2 | OPEN | 9.1 | 1.5 |
| SLB | 4.5 | 4.5 | OPEN |
| RLC | 0 | 0 | 0 |

| #3 | WRITE | ERASE | READ |
|---|---|---|---|
| BL | 1.5 | 1.5 | 1.5 |
| TL2A | 0 | 9.1 | 0 |
| WL | 9.1 | 0 | 1.5 |
| SL | 4.5 | 6 | 0 |
| RL2 | 1.5 | 1.5 | 1.5 |

MC3B (COMPLEMENTARY)

| #3' | WRITE | ERASE | READ |
|---|---|---|---|
| BL2 | 1.5 | 1.5 | 1.5 |
| TL2B | 0 | 9.1 | 0 |
| WL | 9.1 | 0 | 1.5 |
| SL | 4.5 | 6 | 0 |
| RL2 | 1.5 | 1.5 | 1.5 |

MC2A

| #2 | WRITE | ERASE | READ |
|---|---|---|---|
| BL | 1.5 | 1.5 | 1.5 |
| TL1A | 0 | 9.1 | 0 |
| WL | 9.1 | 0 | 1.5 |
| SL | 4.5 | 6 | 0 |
| RL1 | 1.5 | 1.5 | 0 |

MC5A

| #5 | WRITE | ERASE | READ |
|---|---|---|---|
| BL | 1.5 | 1.5 | 1.5 |
| TL2A | 0 | 9.1 | 0 |
| WL2 | OPEN | 9.1 | 1.5 |
| SLB | 4.5 | 6 | 0 |
| RLC | 1.5 | 1.5 | 0 |

FIG. 11

SEMICONDUCTOR MEMORY WITH CHARGE TRANSFER REDUCTION TRANSISTOR

CROSS-REFERENCE TO RELATED APPLICATION

This application is based upon and claims the benefit of priority from the prior Japanese Patent Application No. 2021-059975 filed on Mar. 31, 2021 and the prior Japanese Patent Application No. 2022-047032 filed on Mar. 23, 2022, the entire contents of which are incorporated herein by reference.

BACKGROUND

1. Technical Field

The present invention relates to a semiconductor device, specifically a semiconductor device constituting a single-layer polysilicon type non-volatile memory and a manufacturing method of the semiconductor device.

2. Description of the Related Art

As a non-volatile storage device, a non-volatile memory that writes and erases data by changing accumulated states of electric charges in floating gates as electrically insulated floating electrode layers that constitute write and erasure transistors has been known. As the non-volatile memory, a single-layer polysilicon type non-volatile memory configured by using a single-layer polysilicon has been known (for example, JP-A-2019-62065).

In the single-layer polysilicon type non-volatile memory, for example, a first well region functioning as an active region for writing, a second well region functioning as an active region for reading, and a third well region functioning as an active region for erasure are formed near a superficial layer portion of a semiconductor substrate. On the substrate surface, a tunnel oxide film and a floating gate made of a single-layer polysilicon are formed so as to overlap from the first well region to the third well region. On the surface of the second well region, a read transistor is formed.

In the non-volatile memory, a plurality of memory cells are arranged. The write and erasure transistors of a pair of adjacent memory cells are formed on a common active region, and the respective read transistors are formed on a common active region.

The active region for writing is connected to a word line WL via a contact. The active region for reading is connected to a bit line BL via a contact. The active region for erasure is connected to a wiring TL via a contact. A gate of the read transistor is connected to a read line RL via a contact.

During data writing, for example, a voltage of 9.5 V is applied to the word line WL, and a voltage of 0 V is applied to the bit line BL and the read line RL. Further, 0 V is applied to the wiring TL of a cell that is selected as a write target (hereinafter referred to as a write selected cell), and in a part positioned on the active region for erasure of the floating gate, electrons are injected from the active region to the floating gate by an electric potential difference between WL and TL, thereby executing a writing operation. On the other hand, for a cell that is not selected as a write target (hereinafter referred to as a write unselected cell), 2.5 V is applied to the wiring TL, thereby keeping writing from being executed. For example, a voltage of 3.5 V is applied to a source line SL connected to the active region for reading via a contact, thereby keeping electrons generated on a silicon substrate from being injected to the floating gate from the active region in a region where the read transistor is formed.

SUMMARY

When writing to the write selected cell is executed under the voltage conditions as described above, a part of electrons generated in a part (BL portion) where the contact with the bit line BL in the active region for reading is formed by an electric potential difference between BL and SL are transferred and accelerated in an extending direction of the source line SL, and the electrons are injected to gate insulating films of the read transistor and the floating gate. There has been a problem that this causes characteristic variation of a semiconductor memory.

In order to reduce injection of the electrons to the gate insulating films, a countermeasure of thickening the gate insulating films is considered. However, in that case, there are negative effects that the writing operation slows down and a read current decreases. When the voltage applied to the source line SL is decreased, the electrons are injected from the substrate to the floating gate via the gate insulating films. Therefore, there has been a problem that such a countermeasure is also difficult.

The present invention has been made in consideration of the above-described problems, and an object of the present invention is to provide a semiconductor device that allows reducing injection of an electric charge to a read transistor and a write and erasure transistor during a writing operation to a memory.

A semiconductor device according to the present invention includes a semiconductor substrate and a first memory cell disposed on the semiconductor substrate. The first memory cell includes a first write and erasure transistor, a first read transistor, and a first charge transfer reduction transistor. The first write and erasure transistor controls data writing and erasing. The first read transistor controls data reading. The first charge transfer reduction transistor reduces injection of an electric charge to the first write and erasure transistor and the first read transistor.

The semiconductor device of the present invention allows reducing injection of an electric charge to a read transistor and a write and erasure transistor during a writing operation to a memory.

BRIEF DESCRIPTION OF THE DRAWINGS

Features of the present invention will be described below with reference to the accompanying drawings.

FIG. 9 is a drawing illustrating an example of a voltage application to each of the memory cells when 0 V is applied to a bit line and a read line during data writing and during data erasure;

FIG. 11 is a drawing illustrating an example of a voltage application to each of the memory cells when 1.5 V is applied to the bit line and the read line during data writing and during data erasure;

DETAILED DESCRIPTION

Figure 1:
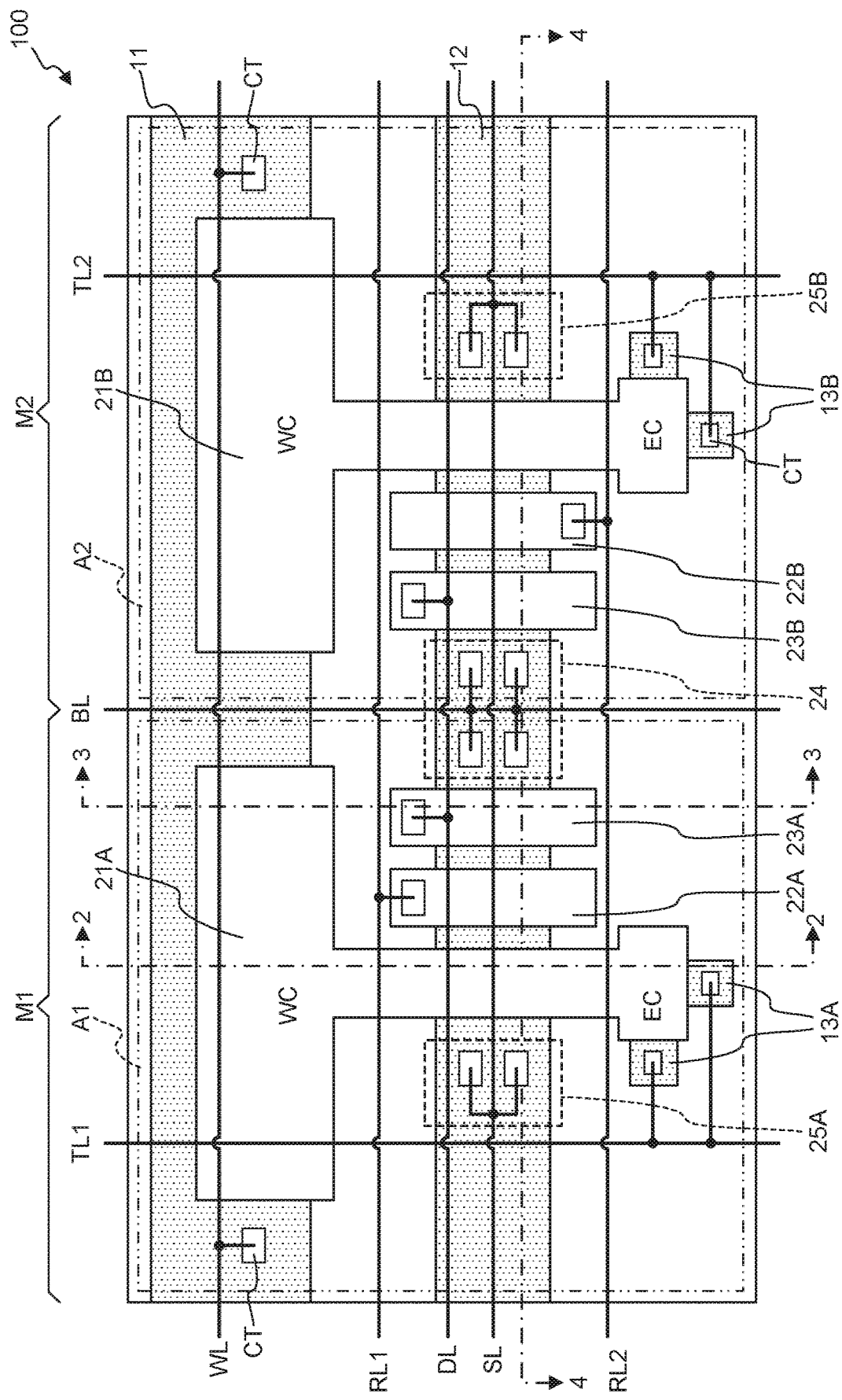
FIG. 1 is a top view illustrating a configuration of a semiconductor memory according to Embodiment 1 of the present invention.

Preferred embodiments of the present invention will be described in detail below. Note that the same reference numerals are given to substantially identical or equivalent parts in the description in the following respective embodiments and the accompanying drawings.

Embodiment 1

FIG. 1 is a top view of a semiconductor memory 100 according to Embodiment 1 of the present invention viewed from above an element formation surface. The semiconductor memory 100 is a semiconductor device constituting memory cells of a single-layer polysilicon type non-volatile semiconductor memory. The semiconductor memory 100 has a structure in which a plurality of memory cells are arranged. Here, among the plurality of memory cells constituting the semiconductor memory 100, a pair of a first memory cell M1 and a second memory cell M2 that are arranged adjacent to one another are illustrated. Here, the first memory cell M1 is a write selected cell and the second memory cell M2 is a write unselected cell. While the illustration is omitted in FIG. 1, in the semiconductor memory 100 of this embodiment, a plurality of similar configurations are further continuously formed in a direction in which the first memory cell M1 and the second memory cell M2 adjoin. Note that in the following description, in a semiconductor substrate constituting the semiconductor memory 100, a region in which the first memory cell M1 is formed is referred to as a first memory cell region A1, and a region in which the second memory cell M2 is formed is referred to as a second memory cell region A2, which are indicated by two-dot chain lines in FIG. 1.

On the semiconductor substrate constituting the semiconductor memory 100, a first active region 11, a second active region 12, third active regions 13A, and fourth active regions 13B are formed.

The first active region 11 is formed so as to extend over the first memory cell region A1 and the second memory cell region A2 in top view, that is, so as to extend in a direction in which the first memory cell M1 and the second memory cell M2 are adjacently arranged. The first active region 11 is configured of a well region of an N-type being a first conductivity type. The first active region 11 is an active region for writing that receives application of a first voltage (for example, 9.5 V) when data is written. On a surface of the first active region 11, a plurality of contacts CT configured of a conductor, such as tungsten, are disposed.

The second active region 12 is formed so as to extend over the first memory cell region A1 and the second memory cell region A2 in top view, that is, so as to extend in a direction in which the first memory cell M1 and the second memory cell M2 are adjacently arranged. The second active region 12 is configured of a well region of a P-type being a second conductivity type that is an opposite conductivity type of the first conductivity type. The second active region 12 is an active region for data reading. On a surface of the second active region 12, a plurality of contacts CT configured of a conductor, such as tungsten, are disposed.

The third active region 13A has a rectangular shape in top view and is disposed at two positions in the first memory cell region A1. The third active region 13A is configured of a well region of the N-type being the first conductivity type. The third active region 13A is an active region for data erasure. On a surface of the third active region 13A, a contact CT configured of a conductor, such as tungsten, is disposed.

The fourth active region 13B has a shape similar to the third active region 13A and is disposed at two positions in the second memory cell region A2. The fourth active region 13B is configured of a well region of the N-type being the first conductivity type. The fourth active region 13B is an active region for data erasure similarly to the third active region 13A. On a surface of the fourth active region 13B, a contact CT configured of a conductor, such as tungsten, is disposed.

The first memory cell M1 includes a write and erasure transistor 21A, a read transistor 22A, and a charge transfer reduction transistor 23A. The second memory cell M2 includes a write and erasure transistor 21B, a read transistor 22B, and a charge transfer reduction transistor 23B.

The write and erasure transistor 21A is formed across the first active region 11, the second active region 12, and the third active regions 13A in the first memory cell region A1. The write and erasure transistor 21A is a transistor for data writing and data erasure.

The write and erasure transistor 21A includes a floating gate on a surface of the first memory cell region A1. The floating gate is a single-layer conductive layer made of a polysilicon film. The floating gate is arranged so as to cross over the upper surfaces of the first active region 11, the second active region 12, and the third active regions 13A and expose a part of each of the surfaces. The floating gate is configured of a part (hereinafter referred to as a write region WC) having a rectangular shape in top view that covers a part of the surface of the first active region 11, a part (hereinafter referred to as an erasure region EC) having a rectangular shape in top view that covers a part of the surfaces of the third active regions 13A, and a strip-shaped part (hereinafter referred to as a strip-shaped region) that connects the write region WC and the erasure region EC so as to traverse the surface of the second active region 12.

The read transistor 22A is formed adjacent to the write and erasure transistor 21A in the first memory cell region A1. The read transistor 22A is formed across the second active region 12 in a direction intersecting an extending direction of the second active region 12. The read transistor 22A is a transistor for data reading.

The read transistor 22A includes a read gate on the surface of the first memory cell region A1. The read gate is a single-layer conductive layer made of a polysilicon film. The read gate has a rectangular shape and is arranged such that its longitudinal direction is orthogonal to the extending direction of the second active region 12 and traverses the surface of the second active region 12. The read gate is arranged parallel to the strip-shaped region of the floating gate at a predetermined interval.

The charge transfer reduction transistor 23A is formed adjacent to the read transistor 22A in the first memory cell region A1. The charge transfer reduction transistor 23A is formed so as to sandwich the read transistor 22A with the write and erasure transistor 21A. The charge transfer reduction transistor 23A is formed across the second active region 12 in the direction intersecting the extending direction of the second active region 12.

The charge transfer reduction transistor 23A includes a charge transfer reduction gate on the surface of the first memory cell region A1. Similarly to the read gate, the charge transfer reduction gate is configured of a single-layer conductive layer made of a polysilicon film. The charge transfer reduction gate has a rectangular shape and is arranged such that its longitudinal direction is orthogonal to the extending direction of the second active region 12 and traverses the surface of the second active region 12. The charge transfer reduction gate is arranged parallel to the read gate of the read transistor 22A at a predetermined interval.

The charge transfer reduction transistor 23A is disposed for reducing injection of an electric charge from the second active region 12 to the read transistor 22A and the strip-shaped region of the floating gate of the write and erasure transistor 21A during a data writing operation (hereinafter simply referred to as during a writing operation) to the semiconductor memory 100. That is, the charge transfer reduction gate is common to the read gate of the read transistor 22A in a point of receiving the application of a voltage during data writing or during data reading. However, the charge transfer reduction gate is what is called a dummy gate that is not directly involved in the operations of writing, reading, and erasure.

The write and erasure transistor 21B is formed across the first active region 11, the second active region 12, and the fourth active regions 13B in the second memory cell region A2. The write and erasure transistor 21B includes a floating gate, which has a shape similar to that of the floating gate of the write and erasure transistor 21A, on a surface of the second memory cell region A2. The floating gate of the write and erasure transistor 21B is arranged so as to cross over the upper surfaces of the first active region 11, the second active region 12, and the fourth active regions 13B and expose a part of each of the surfaces. The write region WC and the erasure region EC are configured on the first active region 11 and the fourth active regions 13B, respectively.

The read transistor 22B is disposed in the second memory cell region A2. The read transistor 22B has a configuration similar to that of the read transistor 22A disposed in the first memory cell region A1. The read transistor 22B includes a read gate, which has a configuration and a shape similar to those of the read gate of the read transistor 22A, on the surface of the second memory cell region A2.

The charge transfer reduction transistor 23B is disposed in the second memory cell region A2. The charge transfer reduction transistor 23B has a configuration similar to that of the charge transfer reduction transistor 23A disposed in the first memory cell region A1. The charge transfer reduction transistor 23B includes an charge transfer reduction gate, which has a configuration and a shape similar to those of the charge transfer reduction gate of the charge transfer reduction transistor 23A, on the surface of the second memory cell region A2.

The first memory cell M1 and the second memory cell M2 are formed in linear symmetry with reference to a boundary of the first memory cell M1 and the second memory cell M2 on the second active region 12. Specifically, on the second active region 12, in the extending direction of the second active region 12, the write and erasure transistor 21A, the read transistor 22A, the charge transfer reduction transistor 23A, the charge transfer reduction transistor 23B, the read transistor 22B, and the write and erasure transistor 21B are formed in this order.

On an element mounting surface of the semiconductor memory 100, a word line WL, read lines RL1 and RL2, a source line SL, a bit line BL, wirings TL1 and TL2, and a dummy read line DL are disposed.

The word line WL is wired along an extending direction of the first active region 11, that is, in a row direction in the drawing. The word line WL is connected to the first active region 11 via the contacts CT disposed on the first active region 11.

The read lines RL1 and RL2 are wired parallel to the word line WL in the row direction. The read line RL1 is connected to the read transistor 22A of the first memory cell M1 via a contact. The read line RL2 is connected to the read transistor 22B of the second memory cell M2 via a contact.

The source line SL is wired on the second active region 12 along its extending direction, that is, in the row direction. The source line SL is connected to the second active region 12 via a plurality of contacts.

The bit line BL is wired on the upper surface of the boundary part of the first memory cell M1 and the second memory cell M2. The bit line BL is wired parallel to a direction in which the strip-shaped regions of the floating gates of the write and erasure transistors 21A and 21B extend, that is, in a column direction in the drawing. The bit line BL is connected to the second active region 12 via contacts. In the following description, a region of a predetermined range including a connection part of the second active region 12 to the bit line BL is referred to as a BL portion 24. Further, regions of a predetermined range including connection parts of the second active region 12 to the source line SL are referred to as SL portions 25A and 25B.

The BL portion 24 is a first region positioned on the boundary part of the first memory cell region A1 and the second memory cell region A2 on the second active region 12. The SL portion 25A is a second region disposed on the second active region 12 in the first memory cell region A1, and the SL portion 25B is a third region disposed on the second active region 12 in the second memory cell region A2. The BL portion 24 and the SL portion 25A are disposed at positions facing one another with a formation position of the write and erasure transistor 21A, the read transistor 22A, and the charge transfer reduction transistor 23A interposed therebetween. The BL portion 24 and the SL portion 25B are disposed at positions facing one another with a formation position of the write and erasure transistor 21B, the read transistor 22B, and the charge transfer reduction transistor 23B interposed therebetween.

The wirings TL1 and TL2 are wired parallel to the bit line BL, that is, in the column direction in the drawing. The wiring TL1 is connected to the third active regions 13A of the first memory cell region A1 via contacts. The wiring TL2 is connected to the fourth active regions 13B of the second memory cell region A2 via contacts.

Furthermore, the dummy read line DL is wired parallel to the read lines RL1 and RL2, that is, in the row direction in the drawing. The dummy read line DL is connected to the charge transfer reduction transistor 23A of the first memory cell M1 and the charge transfer reduction transistor 23B of the second memory cell M2 via contacts.

Figure 2:
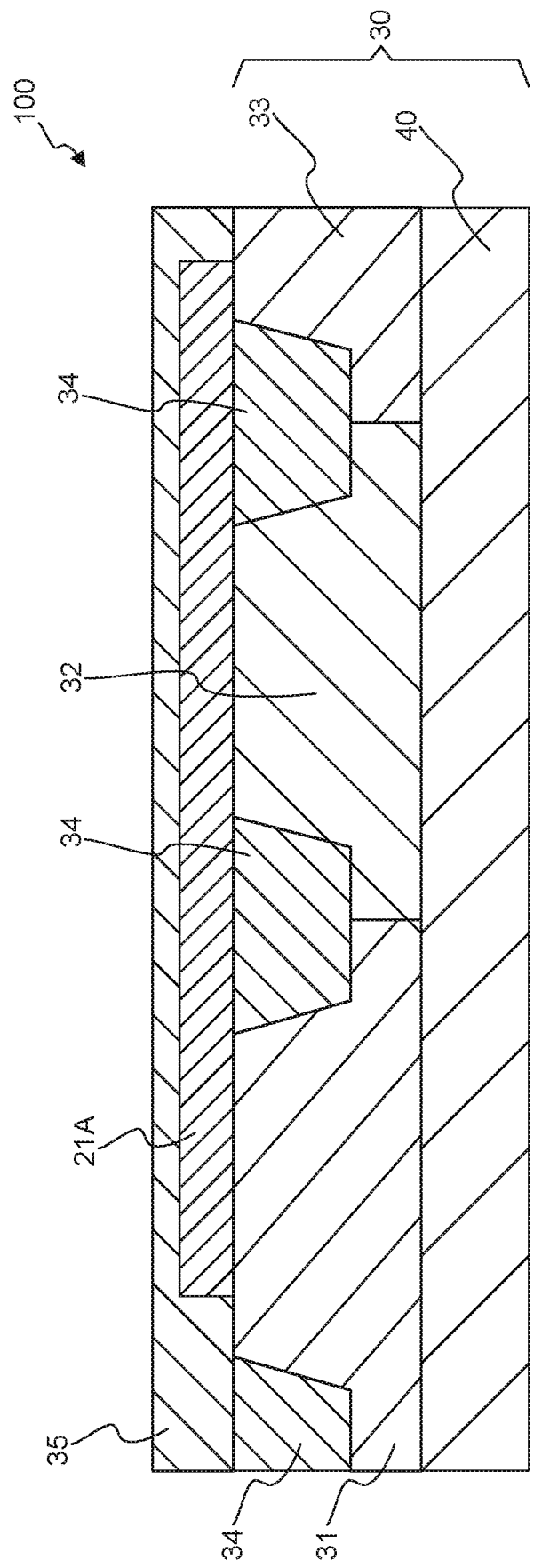
FIG. 2 is a cross-sectional view along the line 2-2 of the semiconductor memory in FIG. 1.
Figure 3:
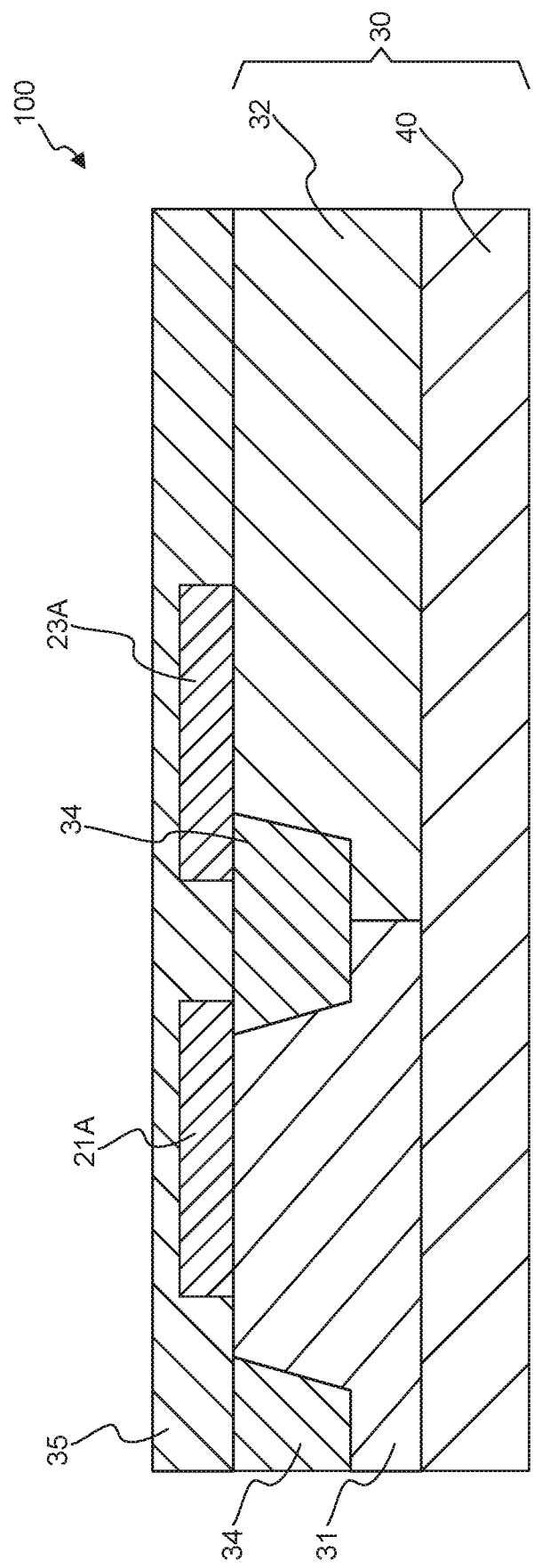
FIG. 3 is a cross-sectional view along the line 3-3 of the semiconductor memory in FIG. 1.

FIG. 2 is a cross-sectional view along the line 2-2 in FIG. 1. FIG. 3 is a cross-sectional view along the line 3-3 in FIG. 1.

Figure 4:
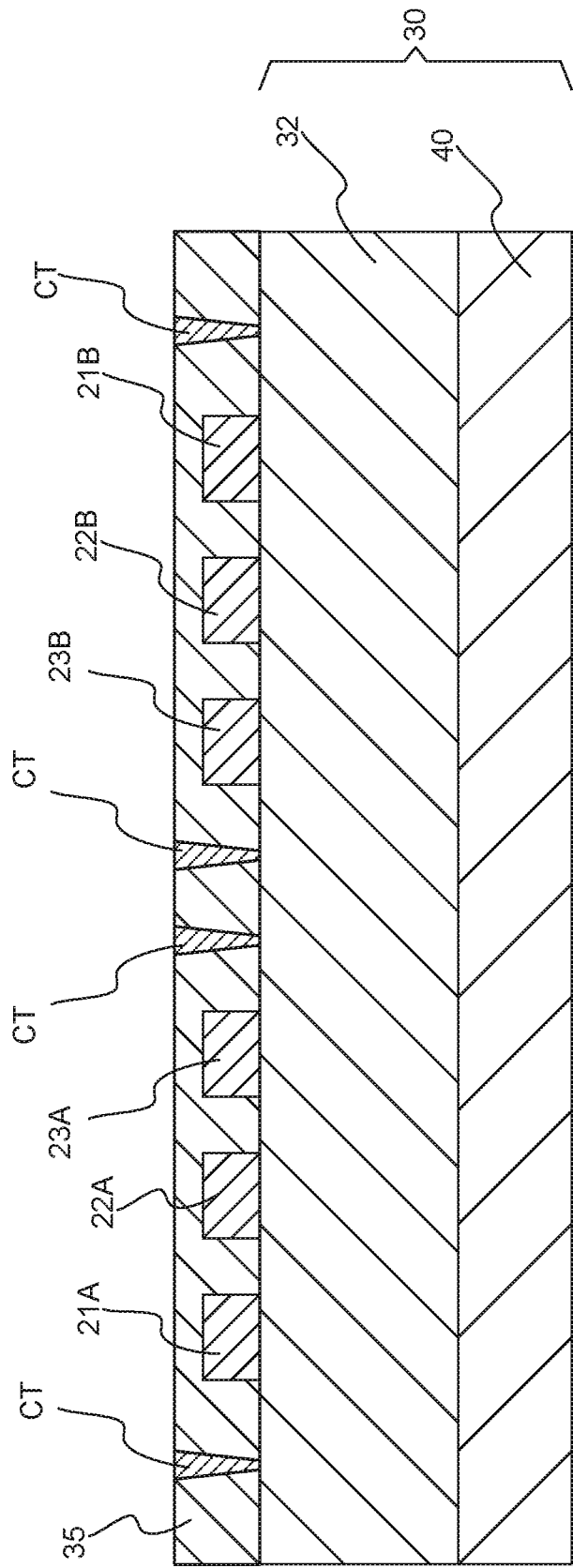
FIG. 4 is a cross-sectional view along the line 4-4 of the semiconductor memory in FIG. 1.

As illustrated in FIG. 2, the semiconductor memory 100 is configured of a first well region 31, a second well region 32, and a third well region 33 that are formed in a semiconductor substrate 30. In FIG. 2, FIG. 3, and FIG. 4, in the semiconductor substrate 30 constituting the semiconductor memory 100, a part where a well region is not formed is illustrated as a silicon substrate 40.

The first well region 31 is an N-type well region constituting the first active region 11 that is the active region for data writing. The second well region 32 is a P-type well region constituting the second active region 12 that is the active region for data reading. The third well region 33 is an N-type well region constituting the third active regions 13A and the fourth active region 13B that are the active regions for data erasure.

In regions between superficial layer portions of the respective well regions, element isolation layers (insulating layers) 34 are formed. The element isolation layer 34 has a Shallow Trench Isolation (STI) structure formed by embedding an oxide film in a groove provided between the adjacent well regions.

A tunnel oxide film (not illustrated) made of a silicon oxide film is formed between the respective surfaces of the first well region 31, the second well region 32, and the third well region 33; and the floating gate of the write and erasure transistor 21A, the read gate of the read transistor 22A, and the charge transfer reduction gates of the charge transfer reduction transistor 23A and the charge transfer reduction transistor 23B.

The write and erasure transistor 21A is a conductive layer constituting the floating gate of the first memory cell M1. A part of the first well region 31 covered with the floating gate of the write and erasure transistor 21A is a well region that functions as a control gate when data is written and erased in the first memory cell M1. A part of the third well region 33 covered with the floating gate of the write and erasure transistor 21A is a well region that functions as a tunnel gate when data is written and erased in the first memory cell M1. The second well region 32 is a well region that functions as a read transistor when data is read from the first memory cell M1.

On the surface of the semiconductor substrate 30, an insulating layer 35 is formed. For example, as illustrated in FIG. 3, the insulating layer 35 is formed so as to cover the surfaces of the floating gate of the write and erasure transistor 21A and the charge transfer reduction gate of the charge transfer reduction transistor 23A and parts of the respective well regions that are exposed to the surface of the semiconductor substrate 30.

FIG. 4 is a cross-sectional view along the line 4-4 in FIG. 1.

A planar part of the second well region 32 that is exposed to the surface of the semiconductor substrate 30 constitutes the second active region 12 as the active region for data reading. On the surface of the second well region 32, a plurality of contacts CT for voltage application are disposed. The strip-shaped region of the floating gate of the write and erasure transistor 21A, the read gate of the read transistor 22A, and the charge transfer reduction gate of the charge transfer reduction transistor 23A are disposed on the surface of the second well region 32 in the first memory cell region A1. The strip-shaped region of the floating gate of the write and erasure transistor 21B, the read gate of the read transistor 22B, and the charge transfer reduction gate of the charge transfer reduction transistor 23B are disposed on the surface of the second well region 32 in the second memory cell region A2.

Figure 5:
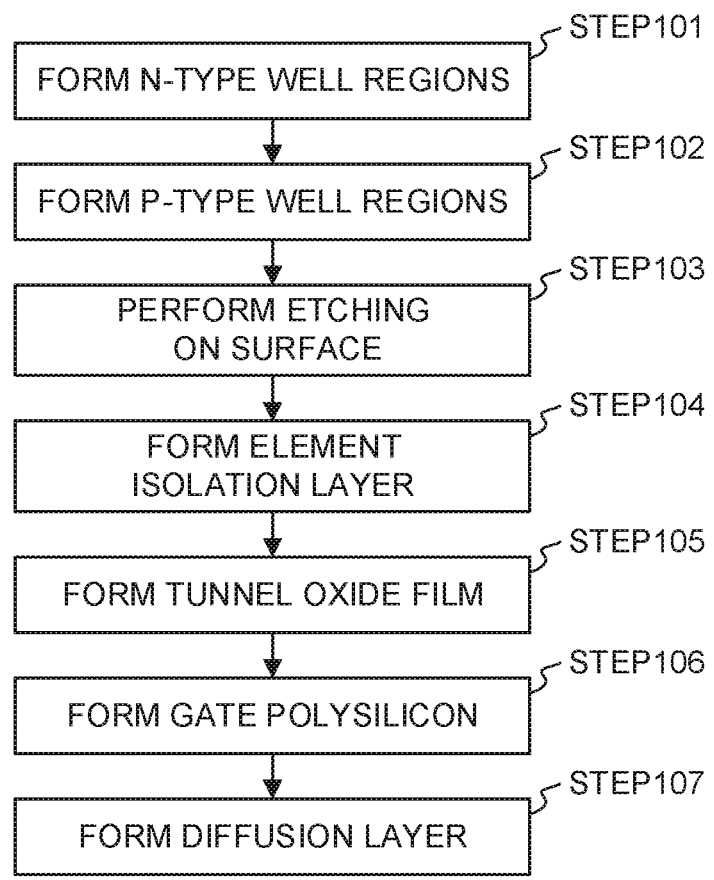
FIG. 5 is a flowchart depicting a manufacturing procedure of a semiconductor device.

Next, a manufacturing method of the semiconductor memory 100 of this embodiment will be described following a manufacturing flow depicted in FIG. 5.

First, a resist film patterned by photolithography is formed on a surface of a semiconductor substrate of the second conductivity type, for example, an Si substrate of the P-type. Then, for example, P+ (phosphorus) or As+ (arsenic) is injected as impurities of the first conductivity type, which is the N-type in this embodiment, to the surface of the semiconductor substrate by ion implantation. This forms the first well region 31 and the third well region 33 that are the N-type well regions (STEP 101).

Next, a resist film is formed on the first well region 31 and the third well region 33 on the surface of the semiconductor substrate, and impurities of the second conductivity type, which is the P-type in this embodiment, are injected. This forms the second well region 32 that is the P-type well region (STEP 102).

Next, etching is performed on the surface of the semiconductor substrate on which the first well region 31, the second well region 32, and the third well region 33 are formed to form grooves (STEP 103).

Next, an insulating film, such as $SiO_2$, is formed on the entire surface of the semiconductor substrate including the grooves by Chemical Vapor Deposition (CVD) method. This forms an element isolation layer (STEP 104).

Next, a silicon oxide film that covers exposed parts of each of the surfaces of the first well region 31, the second well region 32, and the third well region 33 is formed by thermal oxidation method. This forms a tunnel oxide film on the parts (STEP 105).

Next, a polysilicon film is formed so as to cover surfaces of the element isolation layer and the tunnel oxide film by CVD method. This forms the floating gates of the write and erasure transistors 21A and 21B, the read gates of the read transistors 22A and 22B, and the charge transfer reduction gates of the charge transfer reduction transistors 23A and 23B (STEP 106).

Next, a resist film patterned by photolithography is formed on a surface of a wafer on which the above-described processes have been performed. Then, impurities of the second conductivity type, which is the P-type in this embodiment, are injected to the surfaces of the first well region 31 and the third well region 33 by ion implantation. This forms a P-type diffusion region made of a second conductivity type diffusion layer (STEP 107).

Formation of the contacts CT is performed after the above-described processes are performed, and the semiconductor memory 100 of this embodiment is manufactured.

Next, the voltage applied to each wiring during data writing will be described. When data is written to the first memory cell M1, the first voltage (for example, 9.5 V) is applied to the word line WL, and a second voltage (for example, 0 V) is applied to the wiring TL1 connected to the third active regions 13A as the erasure region EC of the first memory cell M1. By an electric potential difference between WL and TL1, electrons are injected to the floating gate of the write and erasure transistor 21A. During data erasure, as opposed to during data writing, the second voltage is applied to the word line WL, and the first voltage is applied to the wiring TL1. This transfers the electrons from the floating gate to the second well region 32.

During data writing, the second voltage is applied to the bit line BL and the read line RL1, and a third voltage (for example, 3.5 V) as a voltage between the first voltage and the second voltage is applied to the source line SL. Then, 0 V being the second voltage that is identical to the voltage applied to the read line RL is applied to the dummy read line DL. This applies 0 V to the charge transfer reduction gate of the charge transfer reduction transistor 23A.

With the charge transfer reduction transistor 23A, the injection of an electric charge from the second active region 12 to the read transistor 22A and the write and erasure transistor 21A is reduced. That is, the charge transfer reduction transistor 23A of this embodiment plays a role in reducing the injection of an electric charge to the read transistor 22A and the write and erasure transistor 21A.

If such an charge transfer reduction transistor as the present invention is not provided, electrons are generated at the BL portion 24 by an electric potential difference between BL and SL during data writing, and the electrons are transferred along an extending direction of the source line SL. The transferred electrons are injected to the gate insulating films of the read transistor 22A and the write and erasure transistor 21A, thereby causing characteristic variation.

In contrast to this, in the semiconductor memory 100 of this embodiment, since the electrons generated at the BL portion 24 are transferred to the charge transfer reduction transistor 23A, the injection of an electric charge to the read transistor 22A and the write and erasure transistor 21A in the first memory cell M1 is reduced. Similarly, in the second memory cell M2, the charge transfer reduction transistor 23B reduces the injection of the electrons generated at the BL portion 24 to the read transistor 22B and the write and erasure transistor 21B.

Note that, in the second memory cell M2 that is the write unselected cell, a fourth voltage (for example, 2.5 V) as a voltage between the first voltage and the second voltage is applied to the wiring TL2 such that data is not written to the second memory cell M2 during data writing.

Figure 6:
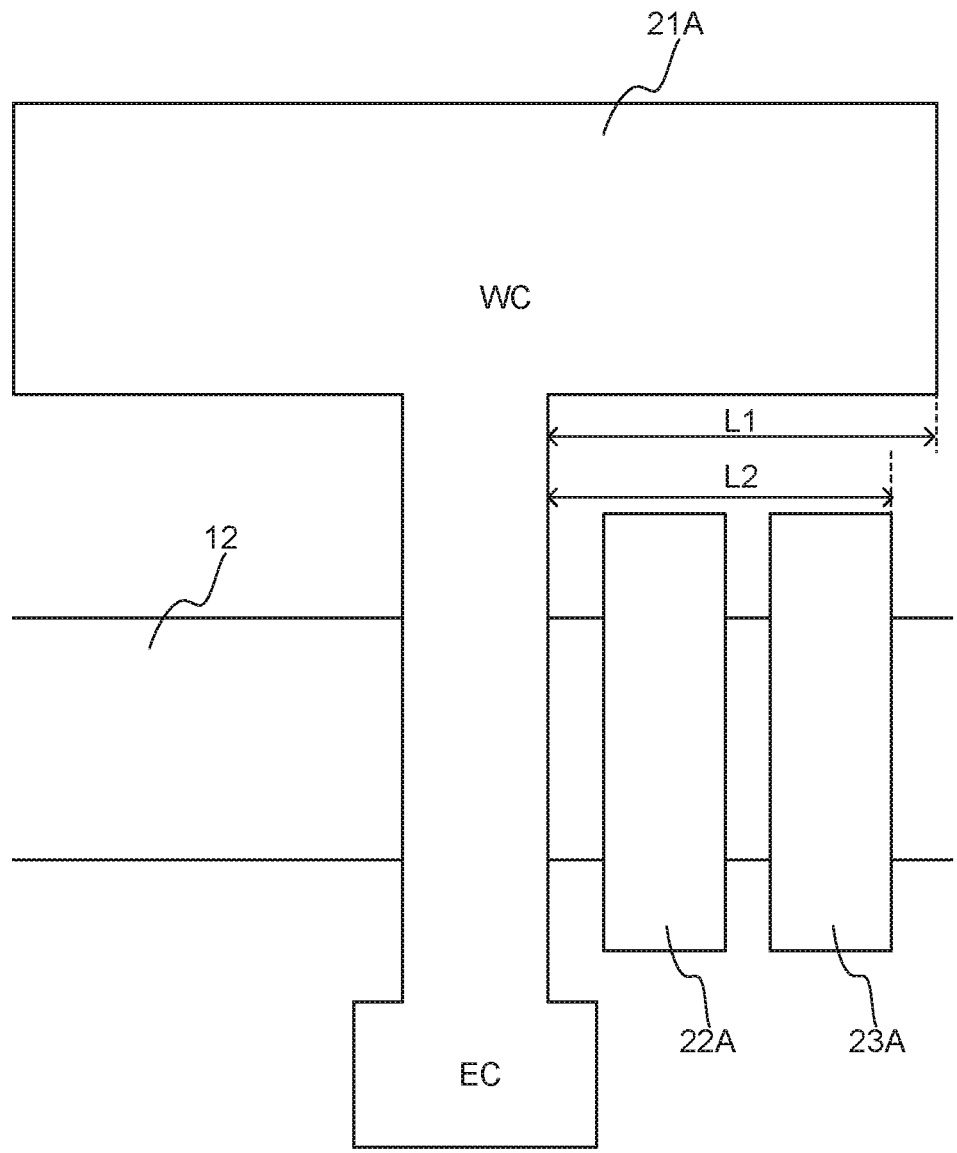
FIG. 6 is a drawing illustrating a positional relation between a floating gate and an charge transfer reduction gate.

In the semiconductor memory 100 of this embodiment, as illustrated in FIG. 6, a distance L2 from an end portion of the strip-shaped part of the floating gate of the write and erasure transistor 21A to an end portion of the charge transfer reduction gate of the charge transfer reduction transistor 23A on the second active region 12 is shorter than a length L1 of a part of the write region WC of the floating gate of the write and erasure transistor 21A projecting from the strip-shaped region. That is, the distance L2 is shorter than a length from a boundary of the write region WC being a rectangular region and the strip-shaped part to an end portion of the write region WC in the extending direction of the first active region 11. In view of this, without increasing a cell size compared with a case where a charge transfer reduction transistor is not provided, the injection of an electric charge from the second active region 12 to the read transistor 22A and the write and erasure transistor 21A can be reduced.

Arrangement positions of the charge transfer reduction transistors 23A and 23B are not limited to those illustrated in FIG. 1. Further, separately from the charge transfer reduction transistors 23A and 23B, a charge transfer reduction transistor having a similar function may be further disposed.

Embodiment 2

Figure 7:
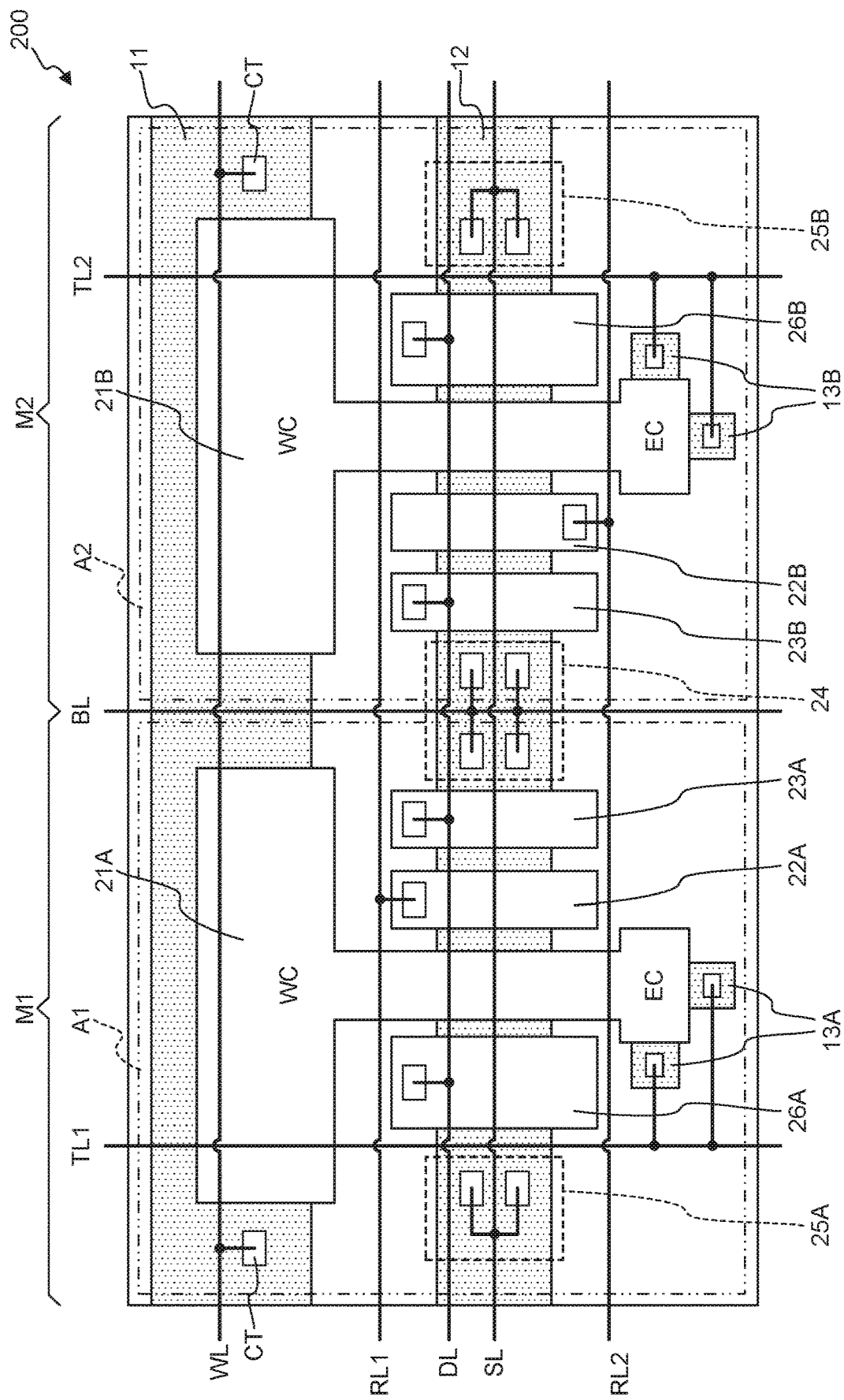
FIG. 7 is a top view illustrating a configuration of a semiconductor memory according to Embodiment 2 of the present invention.

FIG. 7 is a top view of a semiconductor memory 200 of Embodiment 2 that is made in consideration of such a point viewed from above an element formation surface.

The first memory cell M1 has a charge transfer reduction transistor 26A in addition to the charge transfer reduction transistor 23A. In the first memory cell region A1, as illustrated in FIG. 7, the charge transfer reduction transistor 26A is formed at a position facing the read transistor 22A and the charge transfer reduction transistor 23A, for example, with the write and erasure transistor 21A interposed therebetween. The charge transfer reduction transistor 26A is formed across the second active region 12 in the direction intersecting the extending direction of the second active region 12.

The charge transfer reduction transistor 26A has a charge transfer reduction gate on the surface of the first memory cell region A1 similarly to the charge transfer reduction transistor 23A. Similarly to the charge transfer reduction gate of the charge transfer reduction transistor 23A, the charge transfer reduction gate is configured of a single-layer conductive layer made of a polysilicon film. The charge transfer reduction gate of the charge transfer reduction transistor 26A has a rectangular shape and is arranged so as to have a longitudinal direction orthogonal to the extending direction of the second active region 12 and traverse a surface between the first region 24 and the second region 25A on the second active region 12. The charge transfer reduction gate of the charge transfer reduction transistor 26A is arranged parallel to the floating gate of the write and erasure transistor 21A at a predetermined interval on the second active region 12.

Similarly to the charge transfer reduction gate of the charge transfer reduction transistor 23A, the charge transfer reduction gate of the charge transfer reduction transistor 26A is connected to the dummy read line DL, and during data writing, a voltage similar to the voltage applied to the read transistor 22A is applied.

Similarly to the charge transfer reduction transistor 23A, the charge transfer reduction transistor 26A has a function to reduce the injection of an electric charge from the second active region 12 to the write and erasure transistor 21A and the read transistor 22A during data writing.

Further, the charge transfer reduction transistor 26A is arranged at a position closer to the SL portion 25A than the BL portion 24. In view of this, for example, in data writing, when a voltage is applied with a logic opposite to that described in the above Embodiment 1, for example, when 3.5 V is applied to the bit line BL and 0 V is applied to the source line SL, by the electric potential difference between BL and SL, electrons generated at the SL portion 25A are injected to the charge transfer reduction transistor 26A. Therefore, compared with a case where the charge transfer reduction transistor 26A is not provided, regardless of the voltage of the wiring, the injection of an electric charge to the read transistor 22A and the write and erasure transistor 21A can be reduced more effectively.

The second memory cell M2 includes a charge transfer reduction transistor 26B in addition to the charge transfer reduction transistor 23B. The charge transfer reduction transistor 26B is disposed in the second memory cell region A2. As illustrated in FIG. 7, the charge transfer reduction transistor 26B has a configuration similar to that of the charge transfer reduction transistor 26A. The charge transfer reduction transistor 26B includes a charge transfer reduction gate, which has a shape similar to that of the charge transfer reduction gate of the charge transfer reduction transistor 26A, on the surface of the second memory cell region A2. The charge transfer reduction gate of the charge transfer reduction transistor 26B is arranged so as to have a longitudinal direction orthogonal to the extending direction of the second active region 12 and traverse a surface between the first region 24 and the third region 25B on the second active region 12. The charge transfer reduction gate of the charge transfer reduction transistor 26B is arranged parallel to the floating gate of the write and erasure transistor 21B at a predetermined interval on the second active region 12. The charge transfer reduction transistor 26B has a function similar to that of the charge transfer reduction transistor 26A.

The charge transfer reduction transistor 26B is arranged at a position closer to the SL portion 25B than the BL portion 24. In view of this, by the electric potential difference between BL and SL similarly to the above, electrons generated at the SL portion 25B are injected to the charge transfer reduction transistor 26B. Therefore, similarly to the charge transfer reduction transistor 26A, regardless of the voltage of the wiring, the charge transfer reduction transistor 26B can reduce the injection of an electric charge to the read transistor 22B and the write and erasure transistor 21B more effectively.

As described above, with the semiconductor memory 100 of this embodiment, the injection of an electric charge to the read transistor and the write and erasure transistor during the writing operation to the memory can be reduced.

Further, as a modification of Embodiment 2, the configuration may be such that only the charge transfer reduction transistor 26A is disposed without providing the charge transfer reduction transistor 23A. The charge transfer reduction transistor 26A is arranged at a position closer to the SL portion 25A than the BL portion 24. In view of this, for example, in data writing, for example, when 3.5 V is applied to the bit line BL and 0 V is applied to the source line SL, by the electric potential difference between BL and SL, electrons generated at the SL portion 25A are injected to the charge transfer reduction transistor 26A. Therefore, the injection of an electric charge to the read transistor 22A and the write and erasure transistor 21A in the first memory cell M1 is reduced. Similarly, in the second memory cell M2, the configuration can be such that only the charge transfer reduction transistor 26B is disposed without providing the charge transfer reduction transistor 23B. By configuring this, the injection of the electrons generated at the BL portion 24 to the read transistor 22B and the write and erasure transistor 21B is reduced.

The present invention is not limited to those described in the above embodiments. For example, the shapes of the first active region 11, the second active region 12, the third active region 13A, and the fourth active region 13B in top view are not limited to those described in the above embodiments.

In the above embodiments, an example in which the floating gates of the write and erasure transistors 21A and 21B, the read gates of the read transistors 22A and 22B, and the charge transfer reduction gates of the charge transfer reduction transistors 23A and 23B are each configured of a conductive layer made of polysilicon has been described. However, the configuration is not limited to this, and these may be configured by using a conductive layer made of another material having a conductive property other than polysilicon.

The voltage values during data writing described in the above embodiments are one example, and the actual voltage values are not limited to those described in the above embodiments. That is, it is only necessary to configure such that, during data writing, when the first voltage, the second voltage, and the third voltage are respectively applied to the first active region 11, the first region of the second active region 12, and the second region of the second active region 12, the second voltage is applied to the read transistor 22A and the charge transfer reduction transistor 23A. Further, it is only necessary to configure such that, during data writing, when the first voltage, the third voltage, and the second voltage are respectively applied to the first active region 11, the first region of the second active region 12, and the second region of the second active region 12, the second voltage is applied to the read transistor 22A and the charge transfer reduction transistor 26A.

Example of Changing Applied Voltage

In the above-described embodiments, as an example of the voltage application during data erasure, the case where 0 V (that is, second voltage) is applied to the bit line BL and the read line RL1, and the third voltage is applied to the source line SL is described. Since the semiconductor memories of the respective embodiments include the charge transfer reduction gates, the injection of the electric charge to the read transistor and the write and erasure transistor can be usually reduced even when such a voltage application is performed.

However, the inventor found that when data writing and erasure was repeatedly performed to the memory cell, the injection of the electric charge from the source line to the floating gate of the write and erasure transistor occurred. Especially, the injection of the electric charge increases when the writing and erasure is repeatedly performed under a high temperature environment (for example, 85□).

To reduce the injection of the electric charge to the floating gate, it is considered to use a predetermined voltage (fourth voltage) higher than the third voltage and lower than the first voltage, instead of the third voltage, as a voltage applied to the source line SL during data erasure. This is described below.

Figure 8:
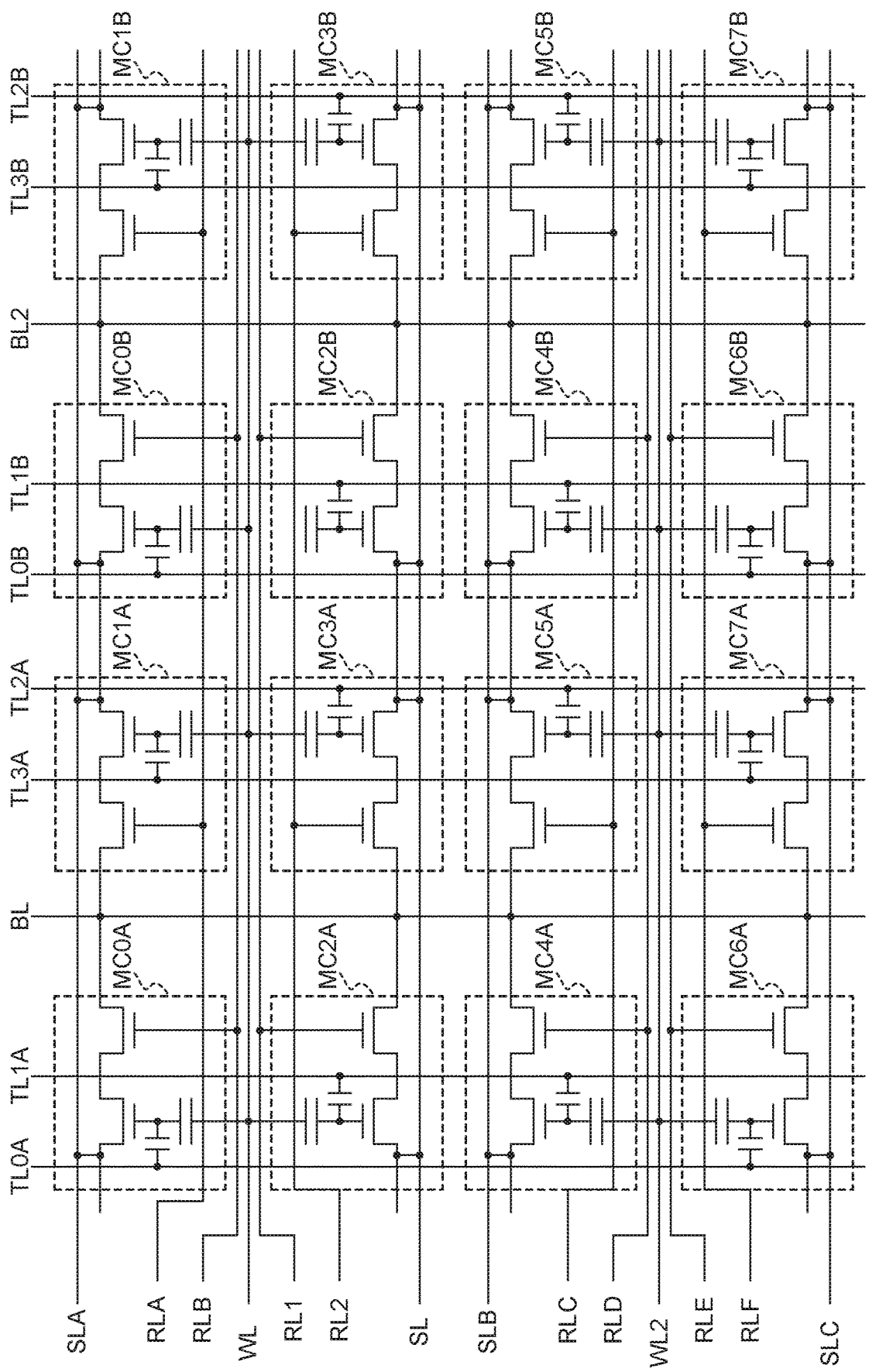
FIG. 8 is a drawing illustrating an arrangement of memory cells in the semiconductor memory.

FIG. 8 is a drawing illustrating an arrangement of memory cells in the semiconductor memory 100. A plurality of the memory cells are arranged in a matrix along the respective extending directions of the word line WL and the bit line BL.

For example, memory cells MC0A, MC1A, MC0B, and MC1B are connected to a common source line SLA, and arranged in a row along the extending direction of the source line SLA. Memory cells MC2A, MC3A, MC2B, and MC3B are connected to a common source line SL, and arranged in a row along the extending direction of the source line SL. Memory cells MC4A, MC5A, MC4B, and MC5B are connected to a common source line SLB, and arranged in a row along the extending direction of the source line SLB. Memory cells MC6A, MC7A, MC6B, and MC7B are connected to a common source line SLC, and arranged in a row along the extending direction of the source line SLC. The memory cell MC0A, MC2A, MC4A, and MC6A are arranged in a row along the extending direction of the bit line BL. The memory cells MC1A, MC3A, MC5A, and MC7A are arranged in a row along the extending direction of the bit line BL. The memory cells MC0B, MC2B, MC4B, and MC6B are arranged in a row along the extending direction of a bit line BL2. The memory cells MC1B, MC3B, MC5B, and MC7B are arranged in a row along the extending direction of the bit line BL2.

The first memory cell M1 and the second memory cell M2 illustrated in FIG. 1 respectively correspond to, for example, the memory cells MC2A and MC3A in FIG. 8. The memory cells MC2A and MC3A are connected to the bit line BL, the word line WL, and the source line SL in common. The memory cell MC3B is a complementary cell of the memory cell MC3A connected to the word line WL, the read line RL2, and the source line SL in common with the memory cell MC3A. The memory cell MC5A is connected to the bit line BL and a wiring TL2A in common with the memory cell MC3A.

FIG. 9 is a drawing illustrating an example of voltage application to each of the memory cells MC3A, MC3B, MC2A, and MC5A before changing the applied voltage, that is, when the second voltage is applied to the bit line BL and the read line RL1, and the third voltage is applied to the source line SL during data writing and during data erasure. Here, a case where the memory cell MC3A, the memory cell MC2A, and the memory cell MC3B are set to the selected cells as targets of writing and erasure, and the memory cell MC5A is set to an unselected cell that is not a target of writing and erasure is illustrated. A case where the memory cell MC3A and the memory cell MC3B are set to the selected cells as targets of reading, and the memory cell MC2A and the memory cell MC5A are set to the unselected cells that are not targets of reading is illustrated.

A case where a thickness of the gate insulating film (oxide film) of the write and erasure transistor is set to about 70□, and the first voltage as a write voltage is set to 9.1 V is illustrated. The second voltage is 0 V, and the third voltage is 4.5 V.

[During Data Writing (Before Changing Applied Voltage)]

The bit line BL, the wiring TL2A, and the read line RL2 connected to the memory cell MC3A as a selected cell for data writing are applied with 0 V, the word line WL is applied with 9.1 V, and the source line SL is applied with 4.5 V. The wiring TL1A and the read line RL1 connected to the memory cell MC2A as a selected cell are applied with 0 V. The bit line BL2 and the wiring TL2B connected to the memory cell MC3B that is a selected cell and a complementary cell of the memory cell MC3A are applied with 0 V. The word line WL2 connected to the memory cell MC5A as an unselected cell is controlled to an open (open-circuit) state, the source line SLB is applied with 4.5 V, and the read line RLC is applied with 0 V.

[During Data Erasure (Before Changing Applied Voltage)]

The bit line BL, the word line WL, and the read line RL2 connected to the memory cell MC3A as a selected cell for data erasure are applied with 0 V, the wiring TL2A is applied with 9.1 V, and the source line SL is applied with 4.5 V. The wiring TL1A connected to the memory cell MC2A as a selected cell is applied with 9.1 V, and the read line RL1 is applied with 0 V. The bit line BL2 connected to the memory cell MC3B that is a selected cell and a complementary cell of the memory cell MC3A is applied with 0 V, and the wiring TL2B is applied with 9.1 V. The word line WL2 connected to the memory cell MC5A as an unselected cell is applied with 9.1 V, the source line SLB is applied with 4.5 V, and the read line RLC is applied with 0 V.

[During Data Reading (Before Changing Applied Voltage)]

The bit line BL, the word line WL, and the read line RL2 connected to the memory cell MC3A as a selected cell for data reading are applied with 1.5 V, and the wiring TL2A and the source line SL are applied with 0 V. The wiring TL1A and the read line RL1 connected to the memory cell MC2A as an unselected cell are applied with 0 V. The bit line BL2 connected to the memory cell MC3B that is a selected cell and a complementary cell of the memory cell MC3A is applied with 1.5 V, and the wiring TL2B is applied with 0 V. The word line WL2 connected to the memory cell MC5A as an unselected cell is applied with 1.5 V, the source line SLB is controlled to an open (open-circuit) state, and the read line RLC is applied with 0 V.

When the data writing and erasure is repeatedly performed with the voltage application as described above, electrons are injected from the source line to the floating gate of the write and erasure transistor in the unselected cell. Such injection of electrons causes characteristic variation of the semiconductor memory.

Figure 10A:
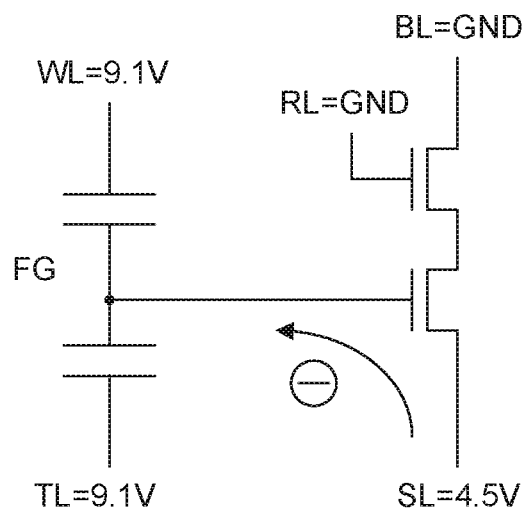
FIG. 10A is a drawing schematically illustrating an injection of electrons to an unselected cell in the voltage application illustrated in FIG. 9.

FIG. 10A is a drawing simplistically illustrating a circuit configuration of the memory cell MC5A as an unselected cell and the injection of electrons when data erasure is performed while selecting the memory cells MC3A, MC2A, and MC3B. Here, the applied voltages during data erasure are illustrated.

Since the voltage difference between the source line SL (4.5 V) and the floating gate FG (9.1 V) is large, the electrons from the source line SL are injected to the floating gate FG as illustrated by an arrow in the drawing. Accordingly, by repeating the data writing and erasure, the reduction in cell current increases. As the voltage difference between the bit line BL and the read line RL increases due to the application of a high voltage to the source line SL, the leak current increases.

Figure 10B:
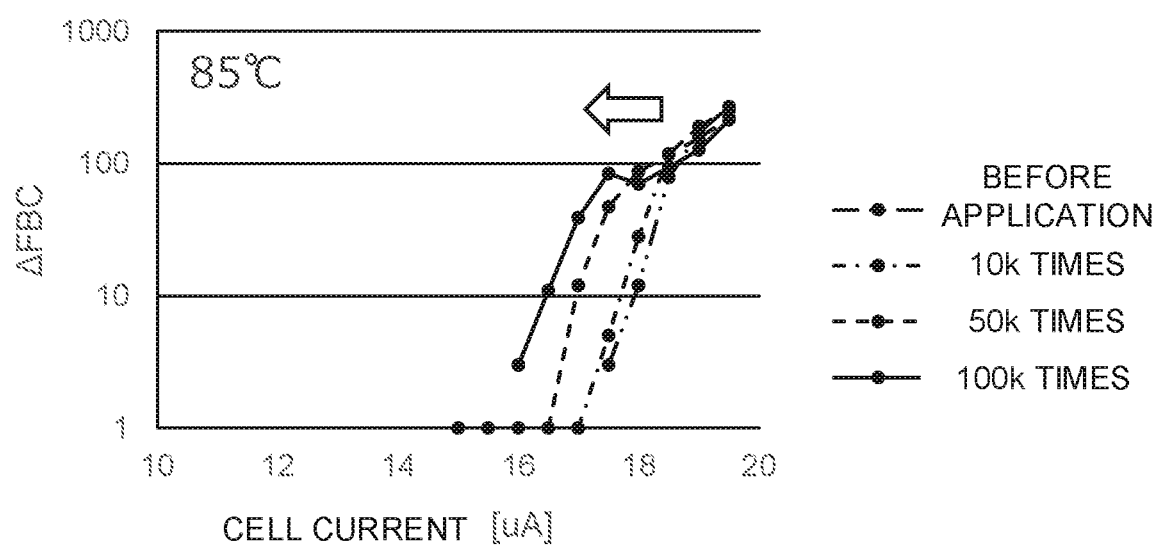
FIG. 10B is a drawing illustrating reductions in cell current when the writing is repeatedly performed on an adjacent cell in the voltage application illustrated in FIG. 9 under a high temperature environment.

FIG. 10B is a drawing illustrating the reduction in cell current when the writing and erasure is repeatedly performed under a high temperature environment (for example, 85□). Here, a state of before applying the voltage for the data writing and erasure, a state where the data writing and erasure has been performed at 10000 times, a state where the data writing and erasure has been performed at 50000 times, and a case where the data writing and erasure has been performed at 100000 times are illustrated in comparison. By repeating the data writing and erasure, the reduction in cell current caused by the injection of electrons from the source line SL to the floating gate FG increases.

In contrast, by changing the applied voltage as below, the injection of electrons to the floating gate FG can be reduced, thus allowing suppressing the reduction in cell current due to the repeated data writing and erasure. Furthermore, the increase of the leak current can be suppressed.

FIG. 11 illustrates an example of the changed applied voltage for each of the memory cells MC3A, MC3B, MC2A, and MC5A.

[During Data Writing (after Changing Applied Voltage)]

The bit line BL and the read line RL2 connected to the memory cell MC3A as a selected cell for data writing are applied with 1.5 V. The read line RL1 connected to the memory cell MC2A as a selected cell, the read line RL2 and the bit line BL2 connected to the memory cell MC3B that is a selected cell and a complementary cell, and the read line RLC connected to the memory cell MC5A as an unselected cell are also applied with 1.5 V.

[During Data Erasure (After Changing Applied Voltage)]

The bit line BL and the read line RL2 connected to the memory cell MC3A as a selected cell for data erasure are applied with 1.5 V, and the source line SL is applied with 6

V. The read line RL1 connected to the memory cell MC2A as a selected cell, the read line RL2 and the bit line BL2 connected to the memory cell MC3B that is a selected cell and a complementary cell, and the read line RLC connected to the memory cell MC5A as an unselected cell are applied with 1.5 V. The source line SLB connected to the memory cell MC5A as an unselected cell is applied with 6 V.

Thus, by setting the applied voltage of the source line during data erasure to 6 V to decrease the voltage difference between the word line WL and the wiring TL, the injection of electrons from the source line to the floating gate can be reduced. In association with the increase of the applied voltage of the source line during data erasure, by setting the applied voltages of the bit line and the read line to 1.5 V not to increase the voltage difference with the applied voltage of the source line, the increase of the leak current can be suppressed.

Figure 12A:
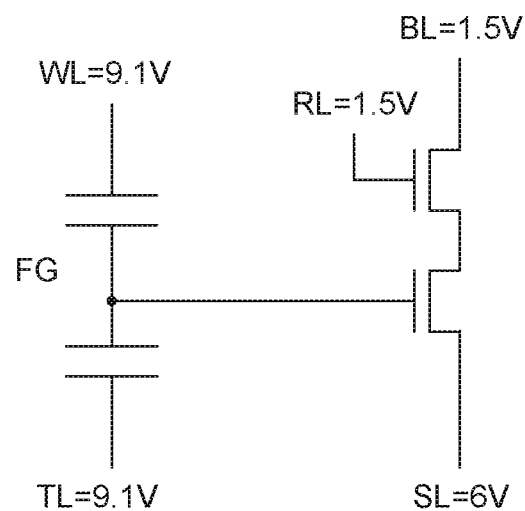
FIG. 12A is a drawing schematically illustrating a reduction in injection of electrons to an unselected cell in the voltage application illustrated in FIG. 11.

FIG. 12A is a drawing illustrating a circuit configuration of the memory cell MC5A as an unselected cell and the applied voltages during data erasure when the data erasure is performed while selecting the memory cells MC3A, MC2A, and MC3B.

Here, the voltage difference between the source line SL (6 V) and the floating gate FG (9.1 V) is small compared with the case illustrated in FIG. 10A. Therefore, the injection of electrons from the source line SL to the floating gate FG is reduced. Accordingly, the reduction of the cell current due to the electron injection is suppressed. The voltage difference between the source line SL (6 V), and the bit line BL (1.5 V) and the read line RL (1.5 V) does not change. Therefore, the increase of the leak current is suppressed.

Figure 12B:
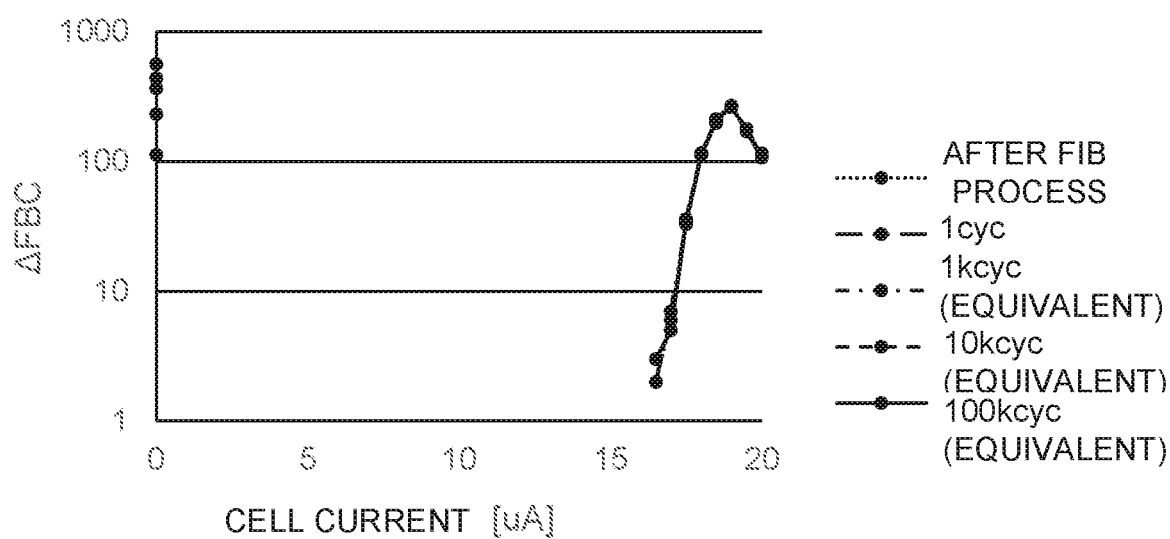
FIG. 12B is a drawing illustrating reductions in cell current when the writing is repeatedly performed on an adjacent cell in the voltage application illustrated in FIG. 11 under a high temperature environment.

FIG. 12B is a drawing illustrating the reduction in cell current when the writing and erasure is repeatedly performed under a high temperature environment (for example, 85□). Different from the example illustrated in FIG. 10B, since the injection of electrons from the source line to the floating gate is reduced, the variation of cell current due to the repeatedly performed data writing and erasure does not occur.

As described above, for example, when the applied voltage of the word line WL is 9.1 V, by setting the applied voltage of the source line SL to 6 V to decrease the voltage difference between the applied voltages of the word line WL and the wiring TL and the applied voltage of the source line SL, the injection of electrons from the source line SL to the floating gate FG during data erasure can be reduced. For example, when the applied voltage of the source line SL is 6 V, by setting the applied voltages of the bit line BL and the read line RL to 1.5 V not to increase the voltage difference between the source line SL, and the bit line BL and the read line RL, the increase of the leak current can be suppressed.

Accordingly, by changing the applied voltage as described above, in addition to the reduction of the injection of the electric charge to the write and erasure transistor by the charge transfer reduction gate as Embodiment 1 and Embodiment 2, furthermore, the injection of an electric charge to the floating gate in the unselected cell when the data writing and erasure is repeatedly performed can be reduced, and the increase of the leak current can be suppressed.

In the explanations using FIG. 11 and FIG. 12A, a case where the applied voltages of the word line WL and the wiring TL are approximately 9.1 V, the applied voltage of the source line SL is 6 V, and the applied voltages of the bit line BL and the read line RI, are 1.5V is described as an example. However, the specific voltage values are not limited to them. It is only necessary that the source line SL is applied with a voltage such that the voltage differences with the applied voltages of the word line WL and the wiring TL are at least 4.5 V or less, preferably the voltage difference is 3.1 V or less. It is only necessary that the bit line BL and the read line RL are applied with a voltage lower than the applied voltages of the source line SL by approximately 4.5 V. The voltage values of the respective applied voltages include errors of approximately 0.1 V. These specific voltage values are premised on that the gate insulating film (oxide film) has the thickness of about 70□, and when a gate insulating film having a different thickness is used, the voltages applied to the respective lines have different voltage values.

That is, it is only necessary to provide a configuration in which during data erasure, the word line WL is applied with the first voltage, the wiring TL as a wiring for erasure is applied with the first voltage, the source line SL is applied with the fourth voltage higher than the third voltage, which is a voltage between the first voltage and the second voltage applied during data writing, and lower than the first voltage. Furthermore, it is only necessary to provide the configuration in which the bit line BL and the read line RL are applied with a fifth voltage higher than the second voltage and lower than the third voltage during data erasure.

The effect of reducing the injection of the electric charge to the floating gate by changing the applied voltage as described above can be obtained also in a semiconductor memory without the charge transfer reduction gate as Embodiment 1 or Embodiment 2.

Figure 13:
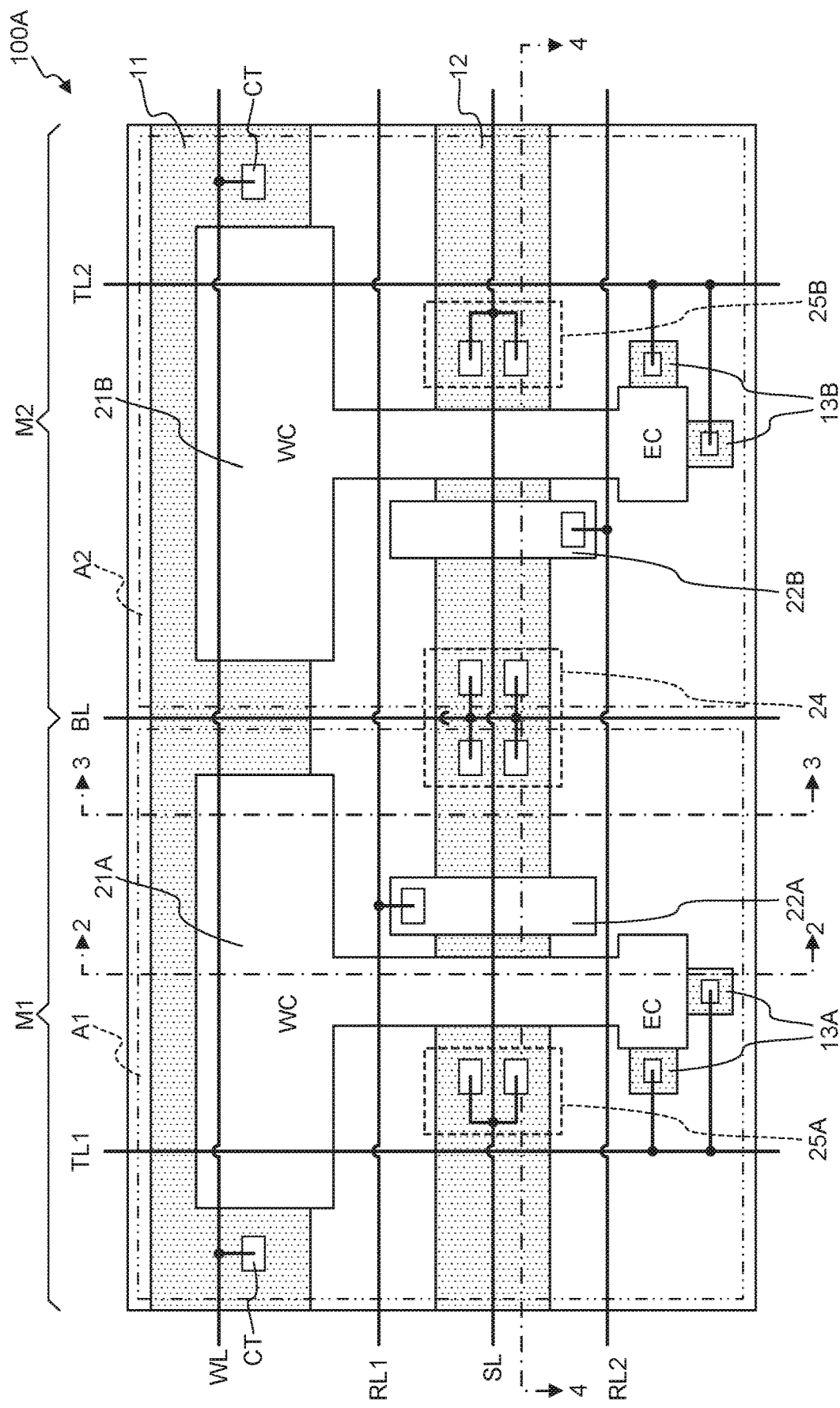
FIG. 13 is a top view illustrating a configuration of a semiconductor memory without a charge transfer reduction transistor.

FIG. 13 is a top view illustrating a configuration of a semiconductor memory 100A in which the charge transfer reduction transistors 23A and 23B are removed from the semiconductor memory 100 illustrated in FIG. 1. Also in the semiconductor memory 100A with such a configuration, by the voltage application similar to the example of changing the applied voltage during erasure, the injection of the electric charge from the source line SL to the floating gate in the unselected cell can be reduced, and the increase of the leak current can be suppressed. For example, when the second memory cell MC2 is a selected cell, and the first memory cell MC1 is an unselected cell, by applying 9 V to the word line WL and the wiring TL, 1.5 V to the read lines RL1 and RL2, and 6 V to the source line SL during data erasure, the injection of the electric charge from the source line SL to the floating gate can be reduced, and the increase of the leak current can be suppressed.

The manufacturing method described in the above embodiments is one example, and manufacturing by processes different from the above-described processes may be employed.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims.

What is claimed is:

1. A semiconductor device comprising:
 a semiconductor substrate; and
 a first memory cell disposed on the semiconductor substrate, wherein
 the semiconductor substrate has:
  a first active region of a first conductivity type, provided for receiving application of a first voltage during data writing, a second active region of a second conductivity type different from the first conductivity type, the second active region being formed to be separated from the first active region, the second active region including:
a first region provided for receiving application of a second voltage, different from the first voltage, during the data writing, and
a second region provided for receiving application of a third voltage, as a voltage between the first voltage and the second voltage, during the data writing, and
a third active region of the first conductivity type formed to be separated from the second active region, the third active region being provided for receiving application of the second voltage during the data writing; and
the first memory cell includes:
a first write and erasure transistor that controls the data writing and erasing;
a first read transistor that controls data reading; and
a first charge transfer reduction transistor that is disposed adjacent to the first region so as to reduce injection of an electric charge from the first region to the first write and erasure transistor and the first read transistor.

2. The semiconductor device according to claim 1, comprising:
a word line that extends along an extending direction of the first active region and is connected to the first active region via a contact disposed on the first active region, the first voltage being applied to the word line during data writing; and
a first read line that extends along an extending direction of the second active region and is connected to the first read transistor via a contact disposed on the first read transistor, the second voltage being applied to the first read line during data writing.

3. The semiconductor device according to claim 1, wherein
the first write and erasure transistor, the first read transistor, and the first charge transfer reduction transistor are disposed between the first region and the second region in the second active region,
the first charge transfer reduction transistor is disposed between the first region of the second active region and the first read transistor, and
the first write and erasure transistor is disposed between the second region of the second active region and the first read transistor.

4. The semiconductor device according to claim 3, wherein
the first memory cell further includes a second charge transfer reduction transistor that reduces injection of an electric charge to the first write and erasure transistor and the first read transistor, and
the second charge transfer reduction transistor is disposed between the second region of the second active region and the first write and erasure transistor.

5. The semiconductor device according to claim 4, comprising:
a bit line that extends in a direction intersecting an extending direction of the first active region and the second active region and is connected to the first region via a contact disposed on the first region of the second active region, the second voltage being applied to the bit line during data writing;
a source line that extends along the extending direction of the second active region and is connected to the second region via a contact disposed on the second region of the second active region, the third voltage being applied to the source line during data writing; and
a dummy read line that extends along the extending direction of the second active region and is connected to the first charge transfer reduction transistor and the second charge transfer reduction transistor via contacts disposed on the first charge transfer reduction transistor and the second charge transfer reduction transistor, the second voltage being applied to the dummy read line during data writing.

6. The semiconductor device according to claim 3, comprising:
a bit line that extends in a direction intersecting an extending direction of the first active region and the second active region and is connected to the first region via a contact disposed on the first region of the second active region, the bit line being configured to receive application of the second voltage during the data writing;
a source line that extends along an extending direction of the second active region and is connected to the second region via a contact disposed on the second region of the second active region, the source line being configured to receive application of the third voltage during the data writing; and
a dummy read line that extends along the extending direction of the second active region and is connected to the first charge transfer reduction transistor via a contact disposed on the first charge transfer reduction transistor, the dummy read line being configured to receive application of the second voltage during the data writing.

7. The semiconductor device according to claim 6, wherein
the first write and erasure transistor includes a first floating gate formed to extend on the semiconductor substrate across the first active region, the second active region, and the third active region,
the first read transistor includes a first read gate formed to be separated from the first floating gate and to traverse the second active region in the direction intersecting the extending direction of the second active region, and
the first charge transfer reduction transistor includes a first charge transfer reduction gate formed to be separated from the first read gate and to traverse the second active region in the direction intersecting the extending direction of the second active region.

8. The semiconductor device according to claim 7, wherein
the first floating gate includes a first rectangular part arranged on the first active region, a second rectangular part arranged on the third active region, and a first strip-shaped part that traverses the second active region and connects the first rectangular part to the second rectangular part, and
a distance from the first strip-shaped part of the first floating gate to an end portion of the first charge transfer reduction gate on the second active region is shorter than a distance from a boundary of the first rectangular part and the first strip-shaped part to an end portion of the first rectangular part in an extending direction of the first active region.

9. The semiconductor device according to claim 4, comprising:
a fourth active region of the first conductivity type formed on the semiconductor substrate and formed to be separated from the second active region and the third active region, and being configured to receive application of the second voltage during the data writing, wherein
the second write and erasure transistor includes a second floating gate formed to extend on the semiconductor substrate across the first active region, the second active region, and the fourth active region,
the second read transistor includes a second read gate formed to traverse the second active region in the direction intersecting the extending direction of the second active region, and
the third charge transfer reduction transistor includes a third charge transfer reduction gate formed to be separated from the second read gate and to traverse the second active region in the direction intersecting the extending direction of the second active region.

10. The semiconductor device according to claim 9, comprising:
a first wiring that extends in the direction intersecting the extending direction of the first active region and the second active region and is connected to the third active region via a contact disposed on the third active region, the first wiring being configured to receive application of the second voltage during the data writing; and
a second wiring that extends in the direction intersecting the extending direction of the first active region and the second active region and is connected to the fourth active region via a contact disposed on the fourth active region, the second wiring being configured to receive application of a fourth voltage as a voltage between the second voltage and the third voltage during the data writing.

11. The semiconductor device according to claim 8, further comprising:
a second memory cell disposed on the semiconductor substrate, wherein
the second memory cell includes:
a second write and erasure transistor that controls the data writing and erasing;
a second read transistor that controls data reading;
a third charge transfer reduction transistor that reduces injection of an electric charge to the second write and erasure transistor and the second read transistor; and
a fourth charge transfer reduction transistor that reduces injection of an electric charge to the second write and erasure transistor and the second read transistor.

12. The semiconductor device according to claim 11, wherein
the second active region further includes a third region that is separated from the first region and the second region, the third region being configured to receive application of the third voltage during the data writing,
the second write and erasure transistor, the second read transistor, the third charge transfer reduction transistor, and the fourth charge transfer reduction transistor are disposed between the first region and the third region in the second active region,
the third charge transfer reduction transistor is disposed between the first region of the second active region and the second read transistor,
the fourth charge transfer reduction transistor is disposed between the third region of the second active region and the second write and erasure transistor, and
the second read transistor is disposed between the second write and erasure transistor and the third charge transfer reduction transistor.

13. The semiconductor device according to claim 12, comprising:
a second read line that extends along the extending direction of the second active region and is connected to the second read transistor via a contact disposed on the second read transistor, the second read line being configured to receive application of the second voltage during the data writing, wherein
the source line is connected to a contact disposed on the third region of the second active region, and
the dummy read line is connected to contacts disposed on the third charge transfer reduction transistor and the fourth charge transfer reduction transistor.

14. The semiconductor device according to claim 1, comprising:
a first active region of a first conductivity type formed on the semiconductor substrate;
a second active region of a second conductivity type different from the first conductivity type, the second active region being formed at a position separated from the first active region on the semiconductor substrate, the second active region including a first region and a second region applied with mutually different voltages during data writing;
a third active region of the first conductivity type formed at a position separated from the second active region on the semiconductor substrate;
a word line that extends in one direction on an upper surface of the semiconductor substrate and is connected to the first active region;
a bit line that extends in a direction intersecting the one direction on the upper surface of the semiconductor substrate and is connected to the first region of the second active region;
a source line that extends in the one direction on the upper surface of the semiconductor substrate and is connected to the second region of the second active region;
a read line that extends in the one direction on the upper surface of the semiconductor substrate and is connected to the first read transistor; and
a wiring for erasure that extends in the direction intersecting the one direction on the upper surface of the semiconductor substrate and is connected to the third active region, wherein
the first write and erasure transistor is disposed on the upper surface of the semiconductor substrate so as to extend from an upper surface of the first active region to an upper surface of the third active region across an upper surface of the second active region,
the first read transistor is disposed on the upper surface of the second active region,
the word line is applied with a first voltage during data erasure to the first memory cell,
the wiring for erasure is applied with the first voltage during data erasure to the first memory cell, and
the source line is applied with a third voltage during data writing to the first memory cell, the third voltage is a voltage between the first voltage and a second voltage lower than the first voltage, and the source line is applied with a fourth voltage during data erasure, and the fourth voltage is higher than the third voltage and lower than the first voltage.

15. The semiconductor device according to claim 14, wherein
each of the bit line and the read line is applied with a fifth voltage higher than the second voltage and lower than the third voltage during data writing and during data erasure to the first memory cell.

16. The semiconductor device according to claim 1, comprising:
a first active region of a first conductivity type formed on the semiconductor substrate, a first voltage being applied to the first active region during data writing;
a second active region of a second conductivity type different from the first conductivity type, the second active region being formed on the semiconductor substrate and formed to be separated from the first active region, the second active region including a first region and a second region, a third voltage as a voltage between the first voltage and a second voltage different from the first voltage being applied to the first region during data writing, the second voltage being applied to the second region during data writing; and
a third active region of the first conductivity type formed on the semiconductor substrate and formed to be separated from the second active region, the second voltage being applied to the third active region during data writing.

17. The semiconductor device according to claim 16, wherein
the first write and erasure transistor, the first read transistor, and the first charge transfer reduction transistor are disposed between the first region and the second region in the second active region,
the first charge transfer reduction transistor is disposed between the second region of the second active region and the first write and erasure transistor, and
the first read transistor is disposed between the first region of the second active region and the first write and erasure transistor.

18. The semiconductor device according to claim 17, wherein
the second floating gate includes a third rectangular part arranged on the first active region, a fourth rectangular part arranged on the fourth active region, and a second strip-shaped part that traverses the second active region and connects the third rectangular part to the fourth rectangular part, and
a distance from the second strip-shaped part of the second floating gate to an end portion of the third charge transfer reduction gate on the second active region is shorter than a distance from a boundary of the third rectangular part and the second strip-shaped part to an end portion of the third rectangular part in an extending direction of the first active region.

19. The semiconductor device according to claim 17, comprising:
a bit line that extends in a direction intersecting an extending direction of the first active region and the second active region and is connected to the first region via a contact disposed on the first region of the second active region, the third voltage being applied to the bit line during data writing;
a source line that extends along the extending direction of the second active region and is connected to the second region via a contact disposed on the second region of the second active region, the second voltage being applied to the source line during data writing; and
a dummy read line that extends along the extending direction of the second active region and is connected to the first charge transfer reduction transistor via a contact disposed on the first charge transfer reduction transistor, the second voltage being applied to the dummy read line during data writing.

20. The semiconductor device according to claim 17, wherein
the first memory cell further includes a second charge transfer reduction transistor that reduces injection of an electric charge to the first write and erasure transistor and the first read transistor, and
the second charge transfer reduction transistor is disposed between the first region of the second active region and the first read transistor.

21. The semiconductor device according to claim 20, comprising:
a bit line that extends in a direction intersecting an extending direction of the first active region and the second active region and is connected to the first region via a contact disposed on the first region of the second active region, the third voltage being applied to the bit line during data writing;
a source line that extends along the extending direction of the second active region and is connected to the second region via a contact disposed on the second region of the second active region, the second voltage being applied to the source line during data writing; and
a dummy read line that extends along the extending direction of the second active region and is connected to the first charge transfer reduction transistor and the second charge transfer reduction transistor via contacts disposed on the first charge transfer reduction transistor and the second charge transfer reduction transistor, the second voltage being applied to the dummy read line during data writing.

22. The semiconductor device according to claim 20, wherein voltage, and the source line is applied with a fourth voltage during data erasure, and the fourth voltage is higher than the third voltage and lower than the first voltage.

23. The semiconductor device according to claim 22, wherein
the first floating gate includes a first rectangular part arranged on the first active region, a second rectangular part arranged on the third active region, and a first strip-shaped part that traverses the second active region and connects the first rectangular part to the second rectangular part, and
a distance from the first strip-shaped part of the first floating gate to an end portion of the second charge transfer reduction gate on the second active region is shorter than a distance from a boundary of the first rectangular part and the first strip-shaped part to an end portion of the first rectangular part in an extending direction of the first active region.

* * * * *